(12) United States Patent
Kim et al.

(10) Patent No.: US 8,710,886 B2
(45) Date of Patent: Apr. 29, 2014

(54) SEMICONDUCTOR MEMORY DEVICE AND METHOD FOR DRIVING THE SAME

(75) Inventors: Kyung-Hoon Kim, Kyoungki-do (KR);
Jun-Woo Lee, Kyoungki-do (KR);
Taek-Sang Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 237 days.

(21) Appl. No.: 12/005,879

(22) Filed: Dec. 28, 2007

(65) Prior Publication Data

US 2009/0058481 A1 Mar. 5, 2009

(30) Foreign Application Priority Data

Sep. 4, 2007 (KR) .................. 10-2007-0089521

(51) Int. Cl.
*H03K 3/017* (2006.01)
*H03K 5/156* (2006.01)

(52) U.S. Cl.
CPC .................... *H03K 5/1565* (2013.01)
USPC .......................................................... 327/175

(58) Field of Classification Search
USPC .................................................. 327/172–176
See application file for complete search history.

(56) References Cited

U.S. PATENT DOCUMENTS

| 5,223,833 | A * | 6/1993 | Akata | 341/100 |
| 6,958,639 | B2 * | 10/2005 | Park et al. | 327/175 |
| 7,180,346 | B2 * | 2/2007 | Lee | 327/175 |
| 7,199,634 | B2 * | 4/2007 | Cho et al. | 327/175 |
| 7,339,403 | B2 * | 3/2008 | Chen et al. | 327/26 |
| 7,352,219 | B2 * | 4/2008 | Minzoni | 327/175 |
| 7,368,966 | B2 * | 5/2008 | Hur | 327/175 |
| 7,629,829 | B2 * | 12/2009 | Lee | 327/298 |
| 7,633,324 | B2 * | 12/2009 | Yun et al. | 327/160 |
| 7,701,273 | B2 * | 4/2010 | Choi | 327/158 |
| 7,777,542 | B2 * | 8/2010 | Ku | 327/158 |
| 2004/0027182 | A1 * | 2/2004 | Brox et al. | 327/158 |
| 2005/0134341 | A1 * | 6/2005 | Lee | 327/172 |
| 2005/0242857 | A1 * | 11/2005 | Minzoni | 327/172 |
| 2006/0001462 | A1 * | 1/2006 | Kim et al. | 327/144 |
| 2006/0028256 | A1 * | 2/2006 | Nam et al. | 327/172 |
| 2007/0030754 | A1 * | 2/2007 | Gomm | 365/233 |
| 2008/0204094 | A1 * | 8/2008 | Hur | 327/158 |

FOREIGN PATENT DOCUMENTS

| JP | 03-085817 | 4/1991 |
| JP | 07-015312 | 1/1995 |
| JP | 2002-042469 | 7/2000 |
| JP | 2003-198343 A | 7/2003 |
| JP | 2004-015810 A | 1/2004 |
| JP | 2004-088679 A | 3/2004 |
| JP | 2005-136949 A | 5/2005 |
| JP | 2006-157909 A | 6/2006 |
| KR | 10-0510515 | 1/2003 |
| KR | 10-0641703 | 8/2004 |
| KR | 10-0728301 | 1/2006 |

* cited by examiner

*Primary Examiner* — Sibin Chen
(74) *Attorney, Agent, or Firm* — Blakely Sokoloff Taylor & Zafman

(57) ABSTRACT

A semiconductor memory device has a duty cycle correction circuit capable of outputting a duty cycle corrected clock and its inverted clock having substantially exactly 180° phase difference therebetween. The semiconductor memory device includes a duty cycle corrector configured to receive a first clock and a second clock to generate a first output clock and a second output clock whose duty cycle ratios are corrected in response to correction signals, and a clock edge detector configured to generate the correction signals corresponding to an interval between a reference transition timing of the first output clock and a reference transition timing of the second output clock.

13 Claims, 5 Drawing Sheets

SEMICONDUCTOR MEMORY DEVICE AND METHOD FOR DRIVING THE SAME

CROSS-REFERENCE TO RELATED APPLICATIONS

The present invention claims priority to Korean patent application number 10-2007-0089521, filed on Sep. 4, 2007, which is incorporated by reference in its entirety.

BACKGROUND OF THE INVENTION

The present invention relates to a semiconductor integrated circuit, and more particularly to a duty cycle correction circuit of a semiconductor integrated circuit.

In a system including a variety of semiconductor devices having various functions, a semiconductor memory device serves as a data storage. The semiconductor memory device outputs data corresponding to addresses received from a data processor, e.g., a central processing unit (CPU), or stores data received from the data processor into unit cells corresponding to addresses inputted together with the data.

As the operating speed of the system is increasing, the data processor requires the semiconductor memory device to input/output data at higher speed. As semiconductor integrated circuit (IC) technologies are rapidly developed, the operating speed of the data processor increases, but the data input/output speed of the semiconductor memory device does not keep up with the increasing operating speed of the data processor.

Many attempts have been made to develop semiconductor memory devices that can increase data input/output speed up to the level required by the data processor. One of these semiconductor memory devices is a synchronous memory device that receives a system clock and processes data in synchronization with the system clock. Specifically, the synchronous memory device outputs or receives data to or from the data processor at each period of the system clock. However, even the synchronous memory device could not keep up with the operating speed of the data processor, and thus a double data rate (DDR) synchronous memory device was developed. The DDR synchronous memory device outputs or receives data at each transition of the system clock. That is, the DDR synchronous memory device outputs or receives data in synchronization with falling edges and rising edges of the system clock.

A duty cycle ratio of the system clock inputted to the DDR synchronous memory device must be maintained at 50% in order to output data at rising and falling edges of the system clock. If the duty cycle ratio of the system clock is not 50%, a processing margin in the operation of outputting data at the rising edge of the system clock becomes different from that in the operation of outputting data at the falling edge of the system clock. As the frequency of the system clock is increasing, the deficient operation processing margin at one of the rising and falling edges means that it is difficult to process data stably.

Therefore, the DDR synchronous memory device includes a duty cycle correction circuit for correcting the duty cycle ratio of the system clock to 50%. Further, the DDR synchronous memory device includes a delay locked loop (DLL) for compensating a delay time of the system clock until data is outputted after the system clock is received. The DLL outputs a delay locked clock, called a DLL clock. If the semiconductor memory device outputs data in synchronization with the delay locked clock, the data are outputted in synchronization with the rising and falling edges of the system clock. The duty cycle correction circuit of the DDR synchronous memory device compensates the duty cycle ratio of the DLL clock outputted from the DLL.

When the semiconductor memory device uses the system clock internally, it can use a received clock a duty cycle ratio of which is corrected by the duty cycle correction circuit. The duty cycle correction circuit can be used to correct the duty cycle ratio of the clock in various kinds of semiconductor devices.

A typical duty cycle correction circuit corrects a duty cycle ratio of a clock using a clock and an inverted clock. When the frequency of the system clock is very high, the duty cycle ratio of the system clock is adjusted. Since a delay time occurring in the operation of inverting the clock having the adjusted duty cycle ratio is not relatively small, the duty cycle correction circuit corrects both the clock and the inverted clock.

During this process, however, the phase difference between the clock and the inverted clock may not become 180°, that is, their phases are distorted. In this case, if the semiconductor memory device operates using the clocks outputted from the duty cycle correction circuit, it cannot perform the predefined operations at each transition of the system clock. If the phase difference between the duty cycle-corrected system clock and the inverted clock is not 180°, data may be outputted irregularly even though the semiconductor memory device outputs the data at each transition of the duty-corrected system clock.

SUMMARY OF THE INVENTION

Embodiments of the present invention are directed to providing a duty cycle correction circuit of a semiconductor device, which can output a duty cycle corrected clock and its inverted clock having substantially exactly 180° phase difference therebetween.

Embodiments of the present invention are directed to providing a DLL including a duty cycle correction circuit which can output a duty cycle corrected clock and its inverted clock having substantially exactly 180° phase difference therebetween.

In accordance with an aspect of the present invention, there is provided a semiconductor memory device which includes a duty cycle corrector configured to receive a first clock and a second clock to generate a first output clock and a second output clock whose duty cycle ratios are corrected in response to correction signals, and a clock edge detector configured to generate the correction signals corresponding to an interval between a reference transition timing of the first output clock and a reference transition timing of the second output clock.

In accordance with another aspect of the present invention, there is provided a method for driving a semiconductor memory device, which includes receiving a first clock and a second clock to generate a first output clock and a second output clock whose duty cycle ratios are corrected in response to correction signals, and generating the correction signals corresponding to an interval between a reference transition timing of the first output clock and a reference transition timing of the second output clock.

In accordance with a third aspect of the present invention, there is provided a semiconductor device which includes a delay locked loop (DLL) configured to perform a delay locking operation on a first clock and a second clock to generate a delay locked clock and its inverted clock as a first output clock and a second output clock, whose duty cycle ratios are corrected in response to correction signals, a clock edge detector configured to generate the correction signals corresponding to an interval between a reference transition timing of the first output clock and a reference transition timing of the second output clock, and a data outputting unit for outputting data using the first output clock and the second output clock.

In accordance with a fourth aspect of the present invention, there is provided a semiconductor device which includes a first correction signal generating unit configured to generate a first correction signal corresponding to an interval between a reference transition timing of a first output clock and a reference transition timing of a second output clock, a second correction signal generating unit configured to generate a second correction signal corresponding to an interval between a reference transition timing of the second output clock and a reference transition timing of the first output clock, a first charge storing unit configured to accumulate electric charges according to the first correction signal, a second charge storing unit configured to accumulate electric charges according to the second correction signal, a first clock generating unit configured to receive a first clock to generate the first output clock having a corrected duty cycle ratio according to the electric charges accumulated in the first charge storing unit, and a second clock generating unit configured to receive a second clock to generate the second output clock having a corrected duty cycle ratio according to the electric charges accumulated in the second charge storing unit.

In accordance with a fifth aspect of the present invention, there is provided a method for driving a semiconductor device, which includes generating a first correction signal corresponding to an interval between a reference transition timing of a first output clock and a reference transition timing of a second output clock, generating a second correction signal corresponding to an interval between a reference transition timing of the second output clock and a reference transition timing of the first output clock, accumulating electric charges to a first charge storing unit according to the first correction signal, accumulating electric charges to a second charge storing unit according to the second correction signal, receiving the first clock to generate the first output clock having a corrected duty cycle ratio according to the electric charges accumulated in the first charge storing unit, and receiving the second clock to generate the second output clock having a corrected duty cycle ratio according to the electric charges accumulated in the second charge storing unit.

DESCRIPTION OF SPECIFIC EMBODIMENTS

Hereinafter, a semiconductor memory device and a method for driving the same in accordance with the present invention will be described in detail with reference to the accompanying drawings.

Figure 1:
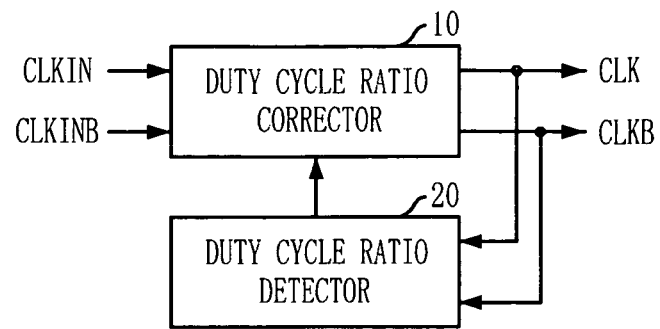
FIG. 1 is a block diagram of a duty cycle correction circuit of a semiconductor device.

FIG. 1 is a block diagram of a duty cycle correction circuit of a semiconductor device.

Referring to FIG. 1, the duty cycle correction circuit includes a duty cycle ratio corrector 10 and a duty cycle ratio detector 20.

The duty cycle ratio corrector 10 corrects duty cycle ratios of a first clock CLKIN and a second clock CLKINB to output duty cycle-corrected clocks CLK and CLKB. The duty cycle ratio detector 10 detects distortion degree between the duty cycle ratios of the clocks CLK and CLKB and controls the duty cycle ratio correct 10 to correct the duty cycle ratios of the clocks CLK and CLKB.

Since the DDR2 synchronous memory device outputs data at both rising and falling edges, it is very important to correct the duty cycle ratio of the system clock. Semiconductor memory devices recently developed include a circuit for internally correcting the duty cycle ratio of a received clock and its inverted clock. However, even though the duty cycle-corrected clocks which have an opposite phase to each other are obtained using the duty cycle correction circuit, the phase difference between the two clocks may not be exactly 180°. This is because the phases of the two clocks are offset from 180° during the operation of correcting the duty cycle ratios of the clocks CLKIN and CLKINB. Therefore, the clocks outputted from the duty cycle correction circuit need to maintain the phase difference of 180°. The two clocks outputted from the duty cycle correction circuit serve as a reference in the data output operation. The reference clocks must maintain the phase difference of 180° in order for the semiconductor memory device to maintain the operation margin, even when the semiconductor memory devices perform the operations in synchronization with the two reference clocks respectively.

Recently, a DLL or phase locked loop (PLL) is used for adjusting the phase difference of the two clocks to 180°. In this case, a circuit area increases due to the arrangement of the DLL or PLL.

Embodiments of the present invention provide a duty cycle correction circuit that can output two clocks with phase difference of 180°. To correct the duty cycle ratio means to make 180° phase difference between reference transition timings of two clocks.

Figure 2:
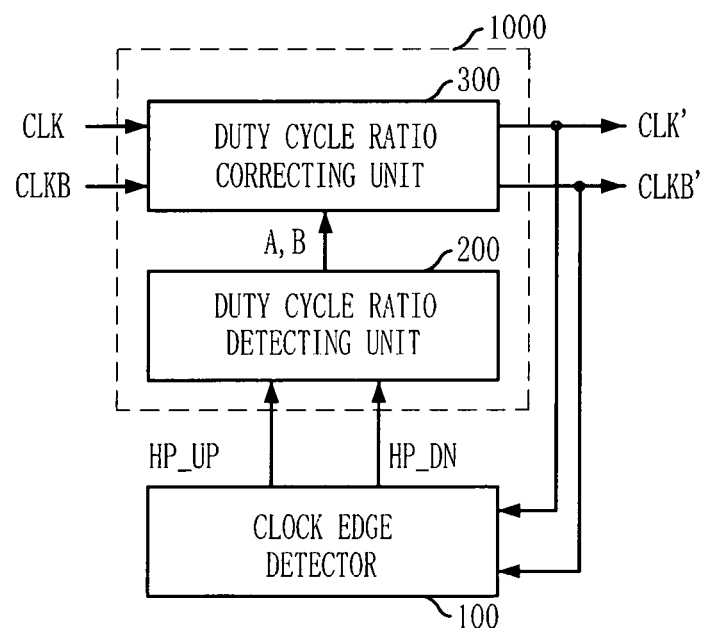
FIG. 2 is a block diagram of a duty cycle correction circuit of a semiconductor device in accordance with an embodiment of the present invention.

FIG. 2 is a block diagram of a duty cycle correction circuit of a semiconductor device in accordance with an embodiment of the present invention.

Referring to FIG. 2, the duty cycle correction circuit includes a duty cycle corrector 1000 and a clock edge detector 100. The duty cycle corrector 1000 includes a duty cycle ratio detecting unit 200 and a duty cycle ratio correcting unit 300. The clock edge detector 100 generates correction signals HP_UP and HP_DN corresponding to an interval between a reference transition timing of a first output clock CLK' and a reference transition timing of a second output clock CLKB'. The duty cycle ratio detecting unit 200 generates a first correction value A corresponding to a first logic level, e.g., a high level, of the correction signals HP_UP and HP_DN, and a second correction value B corresponding to a second logic level, e.g., a low level, of the correction signals HP_UP and HP_DN. The duty cycle ratio correcting unit 300 corrects the duty cycle ratios of a first clock CLK and a second clock CLKB in response to the first correction value A and the second correction value B and outputs the first output clock CLK' and the second output clock CLKB'. The first clock CLK and the second clock CLKB may be any clocks that need to be duty cycle-corrected, for example, external clocks, buffered external clocks, and DLL clocks outputted from a DLL.

To correct the duty cycle ratio means to make 180° phase difference between rising edges or falling edges of two clocks.

Figure 3:
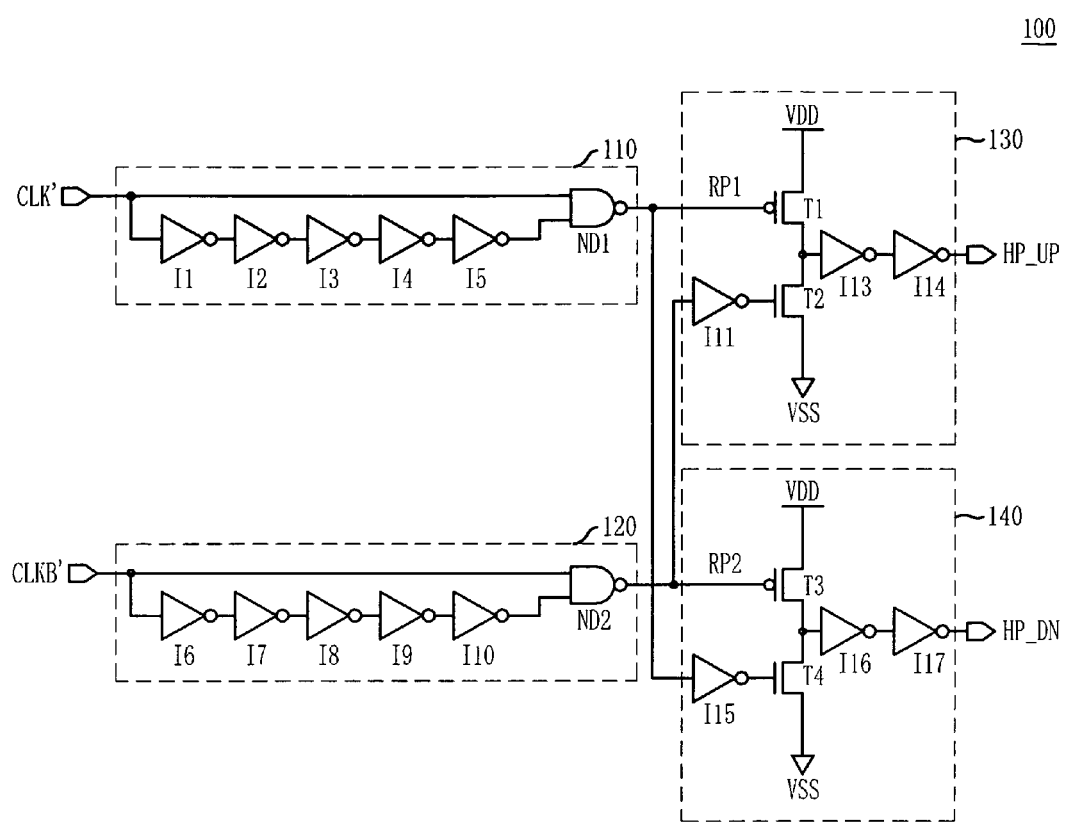
FIG. 3 is a circuit diagram of a clock edge detector illustrated in FIG. 2.

FIG. 3 is a circuit diagram of the clock edge detector illustrated in FIG. 2.

Referring to FIG. 3, the clock edge detector 100 includes a first pulse generating unit 110, a second pulse generating unit 120, a first correction signal generating unit 130, and a second correction signal generating unit 140. The first pulse generating unit 110 generates a first reference pulse RP1 according to a first transition timing of the first output clock CLK'. To this end, the first pulse generating unit 110 includes a plurality of inverters I1 to I5 and a NAND gate ND1. The second pulse generating unit 120 generates a second reference pulse RP2 according to a first transition timing of the second output clock CLKB'. To this end, the second pulse generating unit 120 includes a plurality of inverters I6 to I10 and a NAND gate ND2. The first correction signal generating unit 130 generates a first correction signal HP_UP, a level of which increases to a high level in response to the first reference pulse RP1 and decreases to a low level in response to the second reference pulse RP2. To this end, the first correction signal generating unit 130 includes MOS transistors T1 and T2 and inverters I11, I12, I13 and I14. The second correction signal generating unit 140 generates a second correction signal HP_DN, a level of which increases to a high level in response to the second reference pulse RP2 and decreases to a low level in response to the first reference pulse RP1. To this end, the second correction signal generating unit 140 includes MOS transistors T3 and T4 and inverters I15, I16 and I17.

Figure 4:
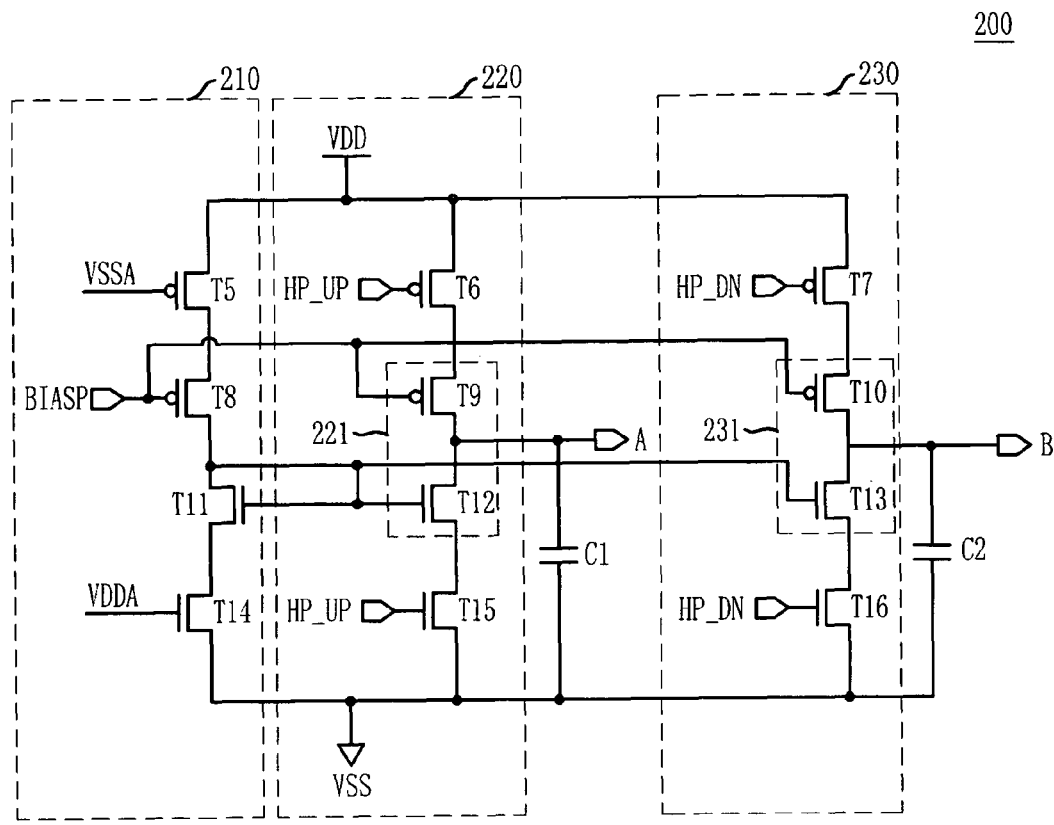
FIG. 4 is a circuit diagram of a duty cycle ratio detecting unit illustrated in FIG. 2.

FIG. 4 is a circuit diagram of the duty cycle ratio detecting unit illustrated in FIG. 2.

Referring to FIG. 4, the duty cycle ratio detecting unit 200 includes a first capacitor C1, a second capacitor C2, a reference current generating unit 210, a first charge/discharge unit 220, and a second charge/discharge unit 230. The first capacitor C1 accumulates electric charges corresponding to the first correction value A, and the second capacitor C2 accumulates electric charges corresponding to the second correction value B. The reference current generating unit 210 generates a reference current. The first charge/discharge unit 220 charges/discharges the first capacitor C1 in response to the first correction signal HP_UP, and the second charge/discharge unit 230 charges/discharges the second capacitor C2 in response to the second correction signal HP_DN.

The reference current generating unit 210 generates the reference current in response to a bias signal BIASP. The reference current generating unit 210 includes a MOS transistor T8 configured to be turned on in response to the bias signal BIASP, a diode-connected MOS transistor T11, and MOS transistors T5 and T14 configured to always maintain turned-on states. The MOS transistors T5 and T14 are used to match pattern type with four serially-connected MOS transistors of the first charge/discharge unit 220 and four serially-connected MOS transistors of the second charge/discharge unit 230.

The first charge/discharge unit 220 includes a switching MOS transistor T15 configured to discharge electric charges accumulated in the first capacitor C1 in response to a high level of the first correction signal HP_UP, a switching MOS transistor T6 configured to charge electric charges to the first capacitor C1 in response to a low level of the first correction signal HP_UP, and a first bias current generating unit 221 configured to be enabled in response to the bias signal BIASP in order for making a current dependent on a reference current flow from the switching MOS transistor T6 to the switching MOS transistor T15. The first bias current generating unit 221 includes a MOS transistor T9 turned on in response to the bias signal BIASP, and a diode-connected MOS transistor T12.

The second charge/discharge unit 230 includes a switching MOS transistor T16 configured to discharge electric charges accumulated in the first capacitor C1 in response to a high level of the second correction signal HP_DN, a switching MOS transistor T16 configured to charge electric charges to the second capacitor C2 in response to a low level of the second correction signal HP_DN, and a second bias current generating unit 231 configured to be enabled in response to the bias signal BIASP in order for making a current dependent on the reference current flow from the switching MOS transistor T7 to the switching MOS transistor T16. The second bias current generating unit 231 includes a MOS transistor T10 turned on in response to the bias signal BIASP, and a diode-connected MOS transistor T13.

Figure 5:
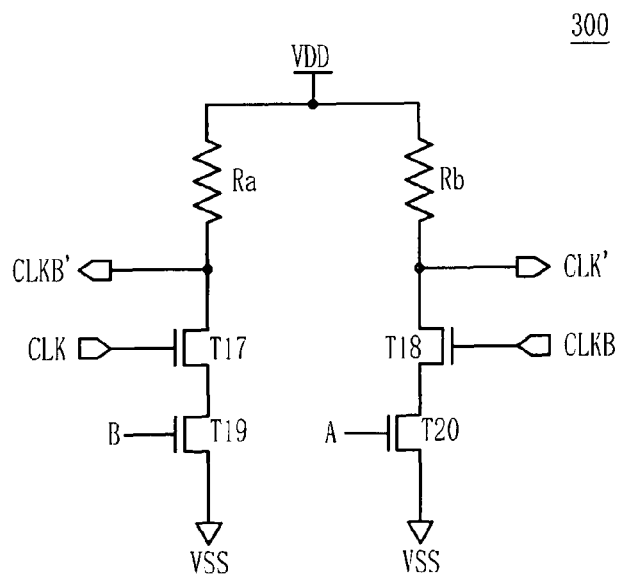
FIG. 5 is a circuit diagram of a duty cycle ratio correcting unit illustrated in FIG. 2.

FIG. 5 is a circuit diagram of the duty cycle ratio correcting unit illustrated in FIG. 2.

Referring to FIG. 5, the duty cycle ratio correcting unit 300 includes a first resistor RA with one terminal connected to the power supply voltage (VDD) terminal, a second resistor RB with one terminal connected to the power supply voltage (VDD) terminal, a MOS transistor T17 which turns on in response to the first clock CLK and has a first terminal connected to the other terminal of the first resistor RA, a MOS transistor T19 connected between a second terminal of the MOS transistor T17 and the ground voltage (VSS) terminal and having a turn-on time determined according to the second correction value B, a MOS transistor M18 which has a first terminal connected to the other terminal of the second resistor RB and turns on in response to the second clock CLKB, a MOS transistor T20 connected between a second terminal of the MOS transistor M18 and the ground voltage (VSS) terminal and having a turn on time-on time determined according to the first correction value A.

Figure 6:
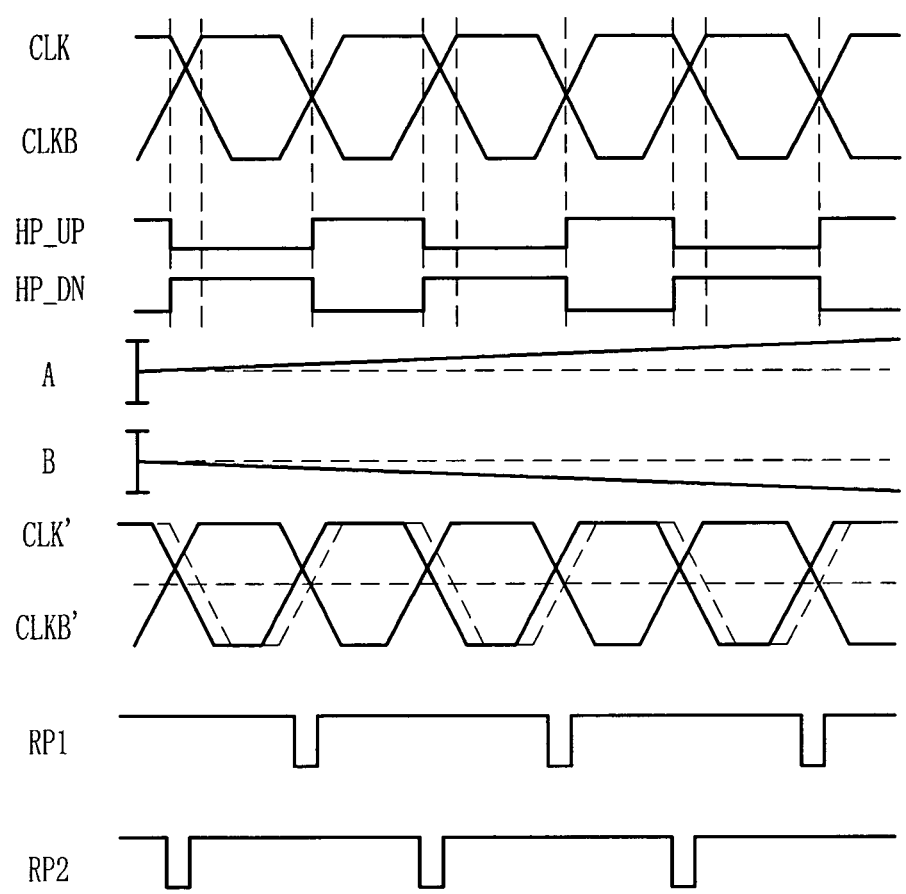
FIG. 6 is a timing diagram of the duty cycle correction circuit illustrated in FIG. 2.

FIG. 6 is a timing diagram of the duty cycle correction circuit illustrated in FIG. 2. An operation of the duty cycle correction circuit in accordance with the embodiment of the present invention will be described below with reference to FIGS. 2 to 6. In this embodiment, the most significant feature of the duty cycle correction circuit is that the clock edge detector 100 detects and measures the transition timing of the output clocks CLK' and CLKB' and the phase of the output clocks CLK' and CLKB' is corrected according to the detection result. That is, the duty cycle correction circuit makes the 180° phase difference between the rising edges of the two clocks CLK' and CLKB'.

The clock edge detector 100 detects the width between the transition timing of the first output clock CLK' and the transition timing of the second output clock CLKB' and generates the correction signals HP_UP and HP_DN corresponding to the detected width. Specifically, the clock edge detector 100 detects the rising edge timing of the first output clock CLK' and the rising edge timing of the second output clock CLKB' and generates the correction signals HP_UP and HP_DN. The first pulse generating unit 110 generates the first reference pulse RP1 corresponding to the rising edge of the first output clock CLK', and the second pulse generating unit 120 generates the second reference pulse RP2 corresponding to the rising edge of the second output clock CLKB'. The first correction signal generating unit 130 generates the first correction signal HP_UP, a level of which increases in response to the transition of the first reference pulse RP1 and decreases in response to the transition of the second reference pulse RP2. The second correction signal generating unit 140 generates the second correction signal HP_DN, a level of which decreases in response to the transition of the first reference pulse RP1 and increases in response to the transition of the second reference pulse RP2.

The reference current generating unit 210 of the duty cycle ratio detecting unit 200 generates a reference current passing through the MOS transistors T5, T8, T11 and T14 in response to the bias signal BIASP. The first charge/discharge unit 220 charges electric charges to the first capacitor C1 according to the low-level duration of the first correction signal HP_UP, and discharges electric charges from the first capacitor C1 according to the high-level duration of the first correction signal HP_UP. The second charge/discharge unit 230 charges electric charges to the second capacitor C2 according to the low-level duration of the second correction signal HP_DN, and discharges electric charges from the second capacitor C2 according to the high-level duration of the second correction signal HP_DN.

As illustrated in FIG. 6, when the low-level duration of the first correction signal HP_UP is longer than the high-level duration of the first correction signal HP_UP, an amount of electric charges accumulated in the first capacitor C1 increases and a voltage level applied to the first capacitor C1 increases. That is, the first correction value A increases. When the high-level duration of the second correction signal HP_DN is longer than the low-level duration of the second correction signal HP_DN, an amount of electric charges accumulated in the second capacitor C2 increases and a voltage level applied to the second capacitor C2 decreases. That is, the second correction value B increases.

The duty cycle ratio correcting unit 300 generates the second output clock CLKB' corresponding to the high level of the clock signal CLK and the second correction value B and generates the first output clock CLK' corresponding to the high level duration of the second clock CLKB and the first correction value A. A relative variation amount of the first correction value A and the second correction value B represents how much the phase difference between the first clock CLK and the second clock CLKB is offset from 180°. Therefore, the duty cycle ratio correcting unit 300 makes the 180 phase difference between the first output clock CLK' and the second output clock CLKB' by correcting the duty cycle ratios of the first clock CLK and the second clock CLKB in response to the first correction value A and the second correction value B.

The duty cycle correction circuit in accordance with the embodiment of the present invention can be applied to a DLL of a synchronous memory device. The DLL generates a DLL clock such that data can be outputted exactly in synchronization with the transition timing of an input clock. The DLL generates the DLL clock by calculating the internal delay amount of an inputted system clock in order to make data outputted exactly in synchronization with the transition timing of the system clock.

The DLL includes a phase comparator and a delay line, and performs a delay locking operation to output the DLL clock. Generally, the DLL generates the DLL clock and its inverted DLL clock together. When the duty cycle ratios of the two clocks are distorted and thus the phase difference between the two clocks is not 180°, the semiconductor memory device cannot output data at the predefined timing, thus degrading its reliability.

By correcting the duty cycle ratio of the DLL clock output from the DLL, the duty cycle correction circuit can maintain the 180° phase difference between the DLL clock and its inverted DLL clock, thereby outputting data at the predefined timing with reliability.

Figure 7:
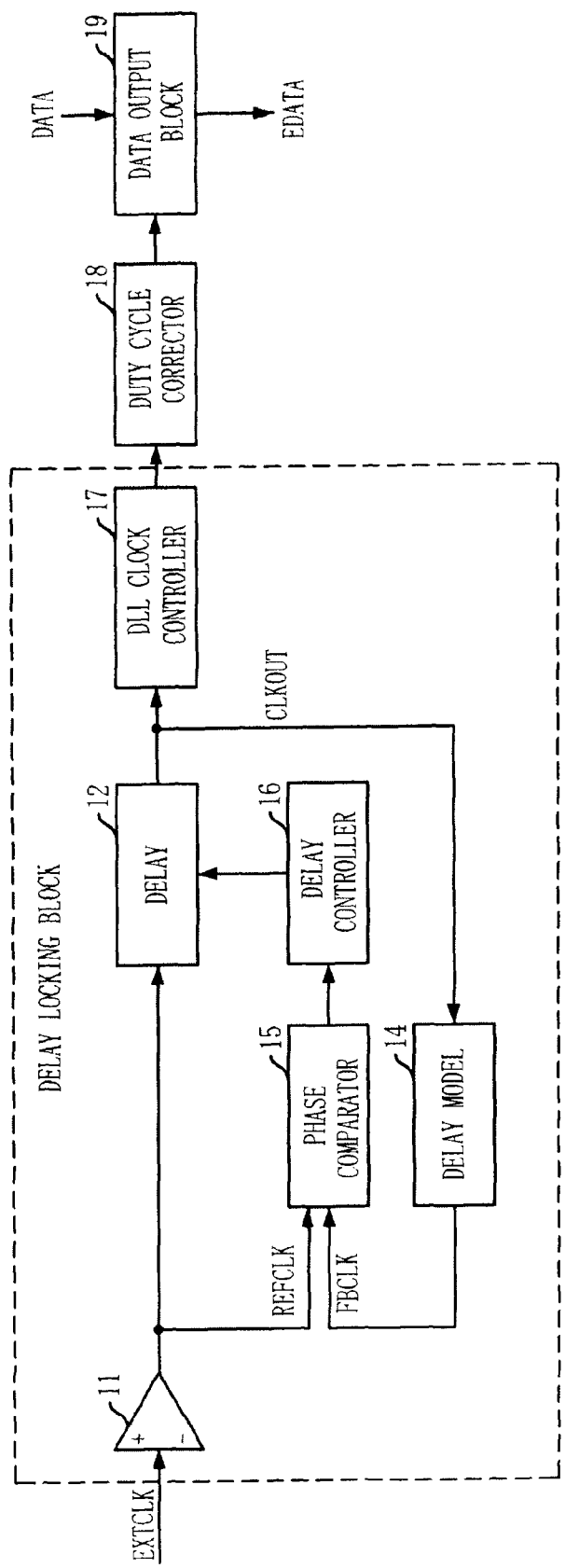
FIG. 7 is a block diagram of the duty cycle correction circuit when it is applied to the DLL.

FIG. 7 is a block diagram of the duty cycle correction circuit when it is applied to a DLL.

Referring to FIG. 7, the DLL includes a clock buffer 11, a delay 12, a delay model 14, a phase comparator 15, a delay controller 16, and a DLL clock driver 17, i.e. a delay locking block. The delay locking block performs a delay locking operation on system clocks EXTCLK to generate a delay locked clock and its inverted clock. Since the delay locking block of FIG. 7 is well known to those skilled in the art, its detailed description will be omitted. The duty cycle correction circuit of FIG. 2 can be applied as described in FIG. 7. That is, the duty cycle correction circuit may include the duty cycle corrector 1000 and the clock edge detector 100 described in FIG. 3. In accordance with the embodiments of the present invention, the DLL further includes the duty cycle corrector 1000. Further a semiconductor memory device of the embodiment of the present invention may include the DLL, the clock edge detector 100, and a data output block 19. In this case, the duty cycle corrector 1000 corrects the duty cycle ratios of a DLL clock and its inverted clock outputted from the DLL clock driver 17 and transfers them to the data output block 19. Therefore, the two clock signals outputted from the duty cycle corrector 18 are inputted to the data output block 19 while maintaining the 180° phase difference in each level transition. The data output block 19 can output data at a predefined timing more correctly.

Unlike in FIG. 7, the duty cycle corrector can be configured to correct the duty cycle ratio of the clock inputted to the DLL and output the corrected clock to the DLL. In this case, the duty cycle corrector corrects the duty cycle ratios of the clocks outputted from the clock buffer 11 and outputs them to the delay 12 and the phase comparator 15. When the duty cycle ratios of the system clock EXTCLK inputted from an external source and its inverted clock are not matched, the duty cycle corrector corrects the duty cycle ratios and transfers them to the DLL. The DLL performs a delay locking operation to generate the more correctly delay-locked clocks.

In accordance with the embodiments of the present invention, the duty cycle correction circuit can more easily generate first and second clock signals with the substantially 180° phase difference.

Further, when applying the duty cycle correction circuit to semiconductor memory devices, data processing timing and data output timing can be maintained with high reliability.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a duty cycle corrector configured to receive a first clock and a second clock to generate a first output clock and a second output clock whose duty cycle ratios are corrected in response to a first correction signal and a second correction signal; and
a clock edge detector configured to receive the first and second output clocks to generate the first and second correction signals activated in a period of an interval between a reference transition timing of the first output clock and the reference transition timing of the second output clock,
wherein the clock edge detector includes:
a first pulse generating unit configured to generate a first reference pulse in response to a first transition of the first output clock;

a second pulse generating unit configured to generate a second reference pulse in response to the first transition of the second output clock;
a first correction signal generating unit configured to generate the first correction signal having the first transition in response to the first reference pulse and a second transition in response to the second reference pulse; and
a second correction signal generating unit configured to generate the second correction signal having the first transition in response to the second reference pulse and the second transition in response to the first reference pulse,
wherein the duty cycle corrector includes:
a duty cycle ratio detecting unit configured to generate a first correction value corresponding to a logic level of the first correction signal and a second correction value corresponding to a logic level of the second correction signal; and
a duty cycle ratio correcting unit configured to correct a duty cycle ratio of the first output clock according to the first correction value, and a duty cycle ratio of the second output clock according to the second correction value,
wherein the duty cycle ratio detecting unit includes:
a first charge storing unit configured to accumulate electric charges corresponding to the first correction value;
a second charge storing unit configured to accumulate electric charges corresponding to the second correction value;
a first switching unit configured to discharge the electric charges accumulated in the first charge storing unit according to the second logic level of the first correction signal;
a second switching unit configured to charge the electric charges to the first charge storing unit according to the first logic level of the first correction signal;
a third switching unit configured to discharge the electric charges accumulated in the second charge storing unit according to the second logic level of the second correction signal; and
a fourth switching unit configured to charge the electric charges to the second charge storing unit according to the first logic level of the second correction signal.

2. The semiconductor memory device as recited in claim 1, wherein the duty cycle ratio detecting unit generates the first correction value by accumulating electric charges in a first logic level duration of the first correction signal and discharging electric charges in a second logic level duration of the first correction signal, and generates the second correction value by accumulating electric charges in a first logic level duration of the second correction signal and discharging electric charges in a second logic level duration of the second correction signal.

3. The semiconductor memory device as recited in claim 1, wherein the duty cycle ratio detecting unit further includes:
a reference current generating unit configured to generate a reference current in response to a bias signal;
a first bias current generating unit configured to be enabled in response to the bias signal to make a first current dependent on the reference current flow from the second switching unit to the first switching unit; and
a second bias current generating unit configured to be enabled in response to the bias signal to make a second current dependent on the reference current flow from the fourth switching unit to the third switching unit.

4. The semiconductor memory device as recited in claim 1, wherein the duty cycle ratio correcting unit includes:

a first output clock generating unit configured to correct the duty cycle ratio of the first clock according to the second correction value to generate the first output clock having the corrected duty cycle ratio; and
a second output clock generating unit configured to correct the duty cycle ratio of the second clock according to the first correction value to generate the second output clock having the corrected duty cycle ratio.

5. The semiconductor memory device as recited in claim 1, wherein the duty cycle ratio correcting unit includes:
a first resistor having one terminal connected to a power supply voltage terminal;
a second resistor having one terminal connected to the power supply voltage terminal;
a fifth switching unit having a first terminal connected to the other terminal of the first resistor and configured to be turned on in response to the first clock;
a sixth switching unit connected between a second terminal of the fifth switching unit and a ground voltage terminal and having a turn-on time determined according to the second correction value;
a seventh switching unit having a first terminal connected to the other terminal of the second resistor and configured to be turned on in response to the second clock; and
an eighth switching unit connected between a second terminal of the seventh switching unit and the ground voltage terminal and having a turn-on time determined according to the first correction value.

6. A method for driving a semiconductor memory device, comprising:
receiving a first clock and a second clock to generate a first output clock and a second output clock whose duty cycle ratios are corrected in response to a first correction signal and a second correction signal; and
receiving the first and second output clocks to generate the first and second correction signals activated in a period of an interval between a reference transition timing of the first output clock and the reference transition timing of the second output clock,
wherein the generating of the first and second correction signals includes:
generating a first reference pulse in response to a first transition of the first output clock;
generating a second reference pulse in response to the first transition of the second output clock;
generating the first correction signal having the first transition in response to the first reference pulse and a second transition in response to the second reference pulse; and
generating the second correction signal having the first transition in response to the second reference pulse and the second transition in response to the first reference pulse,
wherein the generating of the first output clock and the second output clock includes:
generating a first correction value corresponding to a logic level of the first correction signal and a second correction value corresponding to a logic level of the second correction signal; and
correcting a duty cycle ratio of the first output clock according to the first correction value, and a duty cycle ratio of the second output clock according to the second correction value,
wherein the generating of the first correction value and the second correction value includes:

discharging electric charges accumulated in a first charge storing unit according to a first logic level of the first correction signal;

charging electric charges to the first charge storing unit according to a second logic level of the first correction signal;

discharging the electric charges accumulated in a second charge storing unit according to a first logic level of the second correction signal;

charging the electric charges to the second charge storing unit according to a second logic level of the second correction signal;

outputting the first correction value corresponding to the electric charges accumulated in the first charge storing unit; and outputting the second correction value corresponding to the electric charges accumulated in the second charge storing unit.

7. The method as recited in claim 6, wherein the generating of the first and second output clocks includes:

generating the first output clock having the corrected duty cycle ratio by correcting a transition timing of the first clock in response to the second correction value; and generating the second output clock having the corrected duty cycle ratio by correcting a transition timing of the second clock in response to the first correction value.

8. A semiconductor device, comprising:

a delay locked loop (DLL) configured to perform a delay locking operation on a first clock and a second clock to generate a first output clock and a second output clock, whose duty cycle ratios are corrected in response to a first correction signal and a second correction signal;

a clock edge detector configured to generate the first and second correction signals; and a data output block for outputting data using the first output clock and the second output clock, wherein the clock edge detector includes:

a first pulse generating unit configured to generate a first reference pulse in response to a first transition of the first output clock;

a second pulse generating unit configured to generate a second reference pulse in response to the first transition of the second output clock;

a first correction signal generating unit configured to generate the first correction signal having the first transition in response to the first reference pulse and a second transition in response to the second reference pulse; and a second correction signal generating unit configured to generate the second correction signal having the first transition in response to the second reference pulse and the second transition in response to the first reference pulse, wherein the duty cycle ratio detecting unit includes:

a first charge storing unit configured to accumulate electric charges corresponding to the first correction value;

a second charge storing unit configured to accumulate electric charges corresponding to the second correction value;

a first switching unit configured to discharge the electric charges accumulated in the first charge storing unit according to a first logic level of the first correction signal;

a second switching unit configured to charge the electric charges to the first charge storing unit according to a second logic level of the first correction signal;

a third switching unit configured to discharge the electric charges accumulated in the second charge storing unit according to a first logic level of the second correction signal; and a fourth switching unit configured to charge the electric charges to the second charge storing unit according to a second logic level of the second correction signal.

9. The semiconductor device as recited in claim 8, wherein the DLL includes:

a delay locking block configured to perform a delay locking operation on the first clock and the second clock to generate a delay locked the first clock and the second clock; and a duty cycle corrector configured to receive the delay locked he first clock and the second clock to output the first output clock and the second output clock whose duty cycle ratios are corrected in response to the first and second correction signals.

10. The semiconductor device as recited in claim 9, wherein the duty cycle corrector includes:

a duty cycle ratio detecting unit configured to generate a first correction value corresponding to a logic level of the first correction signal and a second correction value corresponding to a logic level of the second correction signal; and a duty cycle ratio correcting unit configured to correct the duty cycle ratio of the first output clock according to the first correction value and the duty cycle ratio of the second output clock according to the second correction value.

11. The semiconductor device as recited in claim 8, wherein the duty cycle ratio detecting unit outputs the first correction value by accumulating electric charges in a first logic level duration of the first correction signal and discharging electric charges in a second logic level duration of the first correction signal, and generates the second correction value by accumulating electric charges in a first logic level duration of the second correction signal and discharging electric charges in a second logic level duration of the second correction signal.

12. The semiconductor device as recited in claim 10, wherein the duty cycle ratio correcting unit includes:

a first resistor having one terminal connected to a power supply voltage terminal;

a second resistor having one terminal connected to the power supply voltage terminal;

a fifth switching unit having a first terminal connected to the other terminal of the first resistor and configured to be turned on in response to the delay locked clock;

a sixth switching unit connected between a second terminal of the fifth switching unit and a ground voltage terminal and having a turn-on time determined according to the second correction value;

a seventh switching unit having a first terminal connected to the other terminal of the second resistor and configured to be turned on in response to the inverted delay locked clock; and an eighth switching unit connected between a second terminal of the seventh switching unit and the ground voltage terminal and having a turn-on time determined according to the first correction value.

13. A semiconductor device, comprising:

a first correction signal generating unit configured to generate a first correction signal corresponding to an interval between a reference transition timing of a first output clock and the reference transition timing of a second output clock;

a second correction signal generating unit configured to generate a second correction signal corresponding to an interval between the reference transition timing of the second output clock and the reference transition timing of the first output clock;

a first charge storing unit configured to accumulate electric charges according to the first correction signal;

a second charge storing unit configured to accumulate electric charges according to the second correction signal;

a first clock generating unit configured to receive a first clock to generate the first output clock having a corrected duty cycle ratio according to the electric charges accumulated in the first charge storing unit; and a second clock generating unit configured to receive a second clock to generate the second output clock having a corrected duty cycle ratio according to the electric charges accumulated in the second charge storing unit, wherein the first correction signal generating unit includes:

a first pulse generating unit configured to generate a first reference pulse in response to a first transition of the first output clock;

a second pulse generating unit configured to generate a second reference pulse in response to the first transition of the second output clock;

a first correction signal generator configured to generate the first correction signal having the first transition in response to the first reference pulse and a second transition in response to the second reference pulse; and a first switching unit configured to discharge the electric charges accumulated in the first charge storing unit according to a first logic level of the first correction signal;

a second switching unit configured to charge the electric charges to the first charge storing unit according to a second logic level of the first correction signal;

a third switching unit configured to discharge the electric charges accumulated in the second charge storing unit according to a first logic level of the second correction signal;

a fourth switching unit configured to charge the electric charges to the second charge storing unit according to a second logic level of the second correction signal;

a reference current generating unit configured to generate a reference current in response to a bias signal;

a first bias current generating unit configured to be enabled in response to the bias signal to make a first current dependent on the reference current flow from the second switching unit to the first switching unit; and a second bias current generating unit configured to be enabled in response to the bias signal to make a second current dependent on the reference current flow from the fourth switching unit to the third switching unit.

* * * * *